| (12) | United States Patent | (10) Patent No.: | US 10,205,073 B2 |
|---|---|---|---|
| | Altamura | (45) Date of Patent: | Feb. 12, 2019 |

(54) PARALLEL WIRE LIGHT STRING AND METHOD OF MANUFACTURER

(71) Applicant: Seasonal Specialties, LLC, Eden Prairie, MN (US)

(72) Inventor: Steven J. Altamura, Scarsdale, NY (US)

(73) Assignee: Seasonal Specialties, LLC, Eden Prairie, MN (US)

( * ) Notice: Subject to any disclaimer, the term of this patent is extended or adjusted under 35 U.S.C. 154(b) by 165 days.

(21) Appl. No.: 15/158,091

(22) Filed: May 18, 2016

(65) Prior Publication Data

US 2016/0341408 A1    Nov. 24, 2016

Related U.S. Application Data

(60) Provisional application No. 62/163,484, filed on May 19, 2015.

(51) Int. Cl.
| | |
|---|---|
| *H01L 21/48* | (2006.01) |
| *H01L 33/62* | (2010.01) |
| *H01L 33/48* | (2010.01) |
| *F21V 21/002* | (2006.01) |
| *F21V 19/00* | (2006.01) |
| *F21S 4/10* | (2016.01) |
| *F21Y 115/10* | (2016.01) |

(52) U.S. Cl.
CPC ............. *H01L 33/62* (2013.01); *F21S 4/10* (2016.01); *F21V 19/001* (2013.01); *F21V 19/0015* (2013.01); *F21V 21/002* (2013.01); *H01L 33/486* (2013.01); *F21Y 2115/10* (2016.08)

(58) Field of Classification Search
CPC .. F21V 19/0015; F21V 21/002; F21V 19/001; F21S 4/10; F21Y 2115/10; Y10S 362/80; F21W 2121/04; H01L 33/486; H01L 33/62

See application file for complete search history.

(56) References Cited

U.S. PATENT DOCUMENTS

| 4,271,458 A | 6/1981 | George, Jr. |
|---|---|---|
| 5,113,329 A | 5/1992 | Lin |
| 5,893,633 A | 4/1999 | Uchio |

(Continued)

FOREIGN PATENT DOCUMENTS

| AU | 2007100087 | 3/2007 |
|---|---|---|
| CN | 1514498 | 7/2004 |
| TW | 581188 | 3/2004 |

OTHER PUBLICATIONS

US Patent and Trademark Office screen shot of IPR proceeding No. 2016-00296 and IPR proceeding No. 2015-01787 dated May 18, 2016.

*Primary Examiner* — Savitr Mulpuri
(74) *Attorney, Agent, or Firm* — Altera Law Group, LLC (57) ABSTRACT

A light set and method of manufacturer with first and second spaced apart conducting wire conducting wires with one of the wires having an insulated coating and the other bare uninsulated. An LED chip is surfaced mounted at intervals along the wires. The insulated wire has its insulation removed at the intervals which may weaken the wire. The bare wire does not require removal of insulation and thus remains stronger and resists kinking. Alternative structures and method of creating an insulated coating are disclosed.

12 Claims, 7 Drawing Sheets

(56) References Cited

U.S. PATENT DOCUMENTS

| | | | |
|---|---|---|---|
| 6,158,882 A | 12/2000 | Bischoff, Jr. | |
| 6,281,435 B1 | 8/2001 | Maekawa | |
| 6,361,186 B1 | 3/2002 | Slayden | |
| 6,604,841 B2 | 8/2003 | Liu | |
| 6,652,112 B1 | 11/2003 | Lucarelli | |
| 6,831,598 B2 | 12/2004 | Saint-Hilaire et al. | |
| 6,837,598 B2 | 1/2005 | Marcus | |
| 6,840,655 B2 | 1/2005 | Shen | |
| 7,235,815 B2 * | 6/2007 | Wang | H01L 33/54 257/74 |
| 7,301,174 B1 | 11/2007 | Popovich | |
| 7,901,263 B2 * | 3/2011 | Tsai | F21S 4/10 445/23 |
| 7,905,652 B2 | 3/2011 | Tsai | |
| 7,926,978 B2 † | 4/2011 | Tsai | |
| 8,397,381 B2 † | 3/2013 | Tsai | |
| 2012/0139068 A1 * | 6/2012 | Stacey | B81C 1/0023 257/417 |

\* cited by examiner
† cited by third party

FIG. 7

PARALLEL WIRE LIGHT STRING AND METHOD OF MANUFACTURER

TECHNICAL FIELD

This disclosure relates to improvements in decorative light strings preferably made with LEDs or other light emitting components.

BACKGROUND

LED lights are preferable to other forms of decorative illumination because of their size, lower heating effect, and low current draw.

U.S. Pat. No. 7,926,978 (which is incorporated herein in its entirety) to Tsai discloses a structure and method for making an LED light string which applies an LED chip to a pair of parallel enamel coated wires. The chip straddles the wire.

A problem with such prior art construction is weakness in the wire caused by grinding contact pads therein. The wire is necessarily very weak at any point where its tubular shape has been tampered with. Curved shapes are always stronger than flat ones. At these weak points, the wire will tend to bend/kink and over time, and possibly break at such point. Further, the aesthetic appearance of smoothly curved wires is desirable and will be lost by kinking.

This disclosure addresses this wire weak point problem and simultaneously reduces cost and the amount of materials used increasing sustainability.

Critical to the success of this type of decorative lighting is low cost of manufacture. The present disclosure provides a structure and method of manufacturing light string devices at a lower cost and also of higher reliability.

SUMMARY

It is desirable to provide a light set with surface mounted light emitting components, which can be easily processed and assembled without unnecessary costs.

To achieve lower cost than prior art devices, I have developed a light string that takes advantage of highly unexpected results, that the insulated coating on one of the parallel wires up which the chip is affixed, need not be insulated and in fact, by using uninsulated wire, performance and reliability is enhanced. It has been assume that insulation on both conductors is essential but there are detriments to such insulation and indeed it can be detrimental in weakening the conductor as explained herein. This insulation provides no practical function because only one wire need be insulated from the other.

In the case of low voltage applications, such as battery power, USB, or transformer voltage reduction, in the unlikely occurrence of a short (caused by a break in the insulation of the other wire), there is no shock or fire hazard. Furthermore, a device (such as PTC or fuse) or thin foil trace that is, or acts like, a fuse can be in inserted in the circuit as further protection.

In the case of line voltage circuits, the connector plug (or elsewhere in line), can be fitted with a polarized plug and/or a circuit for insuring that the uninsulated wire is always the neutral/ground wire. Likewise a fuse can be included in circuit and could incorporate a ground fault interrupting circuit, or arc fault protection for additional safety.

The use of only one insulated conductor in the conductor pair also allows the user to join the uninsulated wire at one location to the uninsulated wire in another location along its length in case that wire breaks. Thus the user can repair the circuit by merely twisting the ends of uninsulated wires together. As mentioned, insulated wires must be scraped at intervals to attach the diodes. This creates weak or kink point where the wire can bend sharply. Even though one wire must be insulated (to prevent shorting by crossover) the LED pads create bridges which give strength to the weaker wire which has been scraped of insulation at intervals. The joining of two parallel wires creates a bending arc which minimizes kinking.

The disclosure also includes, a light set, comprising: a first conducting wire having a first conductor and a first insulating layer enclosing the first conductor, said first insulating layer having a plurality of displaced first openings through said first insulating layer, said first openings defining a respective plurality of first contact-pad areas exposing said first conductor within said plurality of said first contact pad areas; a second conducting wire being disposed adjacent to the first conducting wire, and having a second uninsulated conductor, said second conductor being capable on electrical contact at any point thereon at least one surface mounted light emitting component being straddled on and between respective first and second conductors on said first contact-pad areas on the first conducting wire; the surface mounted light emitting component having a first lead and a second lead, which are electrically connected to the first conductor of the first conducting wire and the second conductor of the second conducting wire, respectively; and a plurality of transparent or translucent packages encapsulating every pair of first contact-pad areas on the first conducting wire and the surface mounted light emitting component bonded thereto; wherein the first conducting wire is enamel-insulated wires; and at least one surface mounted light emitting component is a surface mounted light emitting diode.

The disclosure also includes the first contact areas are formed by flattening the first conductor to produce a flat region.

The disclosure also includes wherein the second conductor further includes second contact areas formed adjacent said first contact areas.

The disclosure also includes wherein the first contact areas are formed by ablating insulation on the first conductor.

The disclosure also includes wherein the first contact areas are formed by etching away insulation on the first conductor.

The disclosure also includes wherein the first contact areas are formed by dissolving away insulation on the first conductor.

The disclosure also includes a light set having a first or second conducting wire having a first conductor at least a partial first insulating layer enclosing part of the first conductor, said first insulating layer including a plurality of slideable insulating segments having longitudinal apertures for receiving said conductor, said segments being placed on said conductor such that a plurality of first gaps between said segments is created, said first gaps defining a respective plurality of first contact-pad areas exposing said first conductor within said plurality of said first contact pad areas; a second conducting wire being disposed adjacent to the first conducting wire, and having a second uninsulated conductor, said second conductor being capable on electrical contact at any point thereon at least one surface mounted light emitting component being straddled on and between respective first and second conductors on said first contact-pad areas on the first conducting wire; the surface mounted light emitting component having a first lead and a second lead, which are electrically connected to the first conductor of the first conducting wire and the second conductor of the second conducting wire, respectively; and a plurality of transparent or translucent (translucent including varying degrees of transmissiveness to transparent) packages encapsulating every pair of first contact-pad areas on the first conducting wire and the surface mounted light emitting component bonded thereto; wherein the first conducting wire is a wire with slideable insulation; and the at least one surface mounted light emitting component is a surface mounted light emitting diode.

The disclosure also includes a method of making a light set having first and second parallel wires and LED chips comprising any or all of the steps in any order of:
  a. providing temporary coverage of portions of the first wire at intervals along its length;
  b. coating the first wire with an insulator while providing said temporary coverage of a portion of the wire at intervals;
  c. removing said temporary coverage, thereby exposing uninsulated portions of the first wire at known intervals;
  d. placing said second wire in parallel with said first wire;
  e. applying an LED chip in electrical contact with said first and second wires at said uninsulated portions, thereby having the wires electrically bridged by said LED chip.

The disclosure also includes further flattening the first wire at said uninsulated portions.

The disclosure also includes coating the wire(s) with a conductive coating, spraying, powder coating or plating with a non insulating coating. This provides a way to color coat the wires without interfering with their electrical accessibility.

The disclosure also includes wherein said second wire is flattened at points corresponding to adjacent uninsulated portions on said first wire. The flattening can be by compression or ablation. If compression, it is possible to form the depression so that the sidewalls are curved rather than stepwise to minimize weakness in the wire (shown on wire 2, but could also be on wire 1). It is also possible that the uninsulated wire has not depressions at all and the chip is affixed on a tubular wire surface, unaltered.

The disclosure also includes:
  a. providing temporary coverage of portions of the second wire at intervals along its length;
  b. coating the second wire with an insulator while providing said temporary coverage;
  c. removing said temporary coverage, thereby exposing uninsulated portions of the second wire at known intervals corresponding to the known intervals of said first wire.

The disclosure also includes wherein the flattening includes creating a depression in the wire with a flat portion and curved edges.

The disclosure also includes methods of manufacturer and construction.

For example, there is disclosed a method of making a light set having first and second parallel wires and LED chips having any or all of the following steps in any order,
  a. providing temporary coverage of portions of the first wire at intervals along its length;
  b. coating the first wire with an insulator while providing said temporary coverage thereby preserving uncoated areas;
  c. removing said temporary coverage, thereby exposing uninsulated portions of the first wire at known intervals;
  d. placing said second wire in parallel with said first wire;
  e. applying an LED chip in electrical contact with said first and second wires at said uninsulated portions, thereby having the wires electrically bridged by said LED chip.

The method may further include flattening the first wire at said uninsulated portions to better receive the LED chip. The flattened area on the wire will preferably have ends which have curvilinear profiles so that there is no point of sharp cut or bend which can allow kinking.

The method may further include a second wire which flattened at points corresponding to adjacent uninsulated portions on said first wire in the same manner as the first wire.

The method may further include:
  a. providing temporary coverage of portions of the second wire at intervals along its length;
  b. coating the second wire with an insulator while providing said temporary coverage;
  c. removing said temporary coverage, thereby exposing uninsulated portions of the second wire at known intervals corresponding to the known intervals of said first wire.

The method may also include the flattening includes creating a depression in the wire with a flat portion and curved edges.

The method may also include coating at least one conductor with an electrically conductive colored coating.

The method may also include providing a slideable insulated tubular coating on one of the wire. The tubular coating is provided in sections and slid on the wire at intervals with a gap in between the intervals. The gap provide uninsulated spaces for receiving one leg of an LED chip, the other leg of the chip being affixed to the other parallel wire.

In this method, the wire could alternatively be fully coated with tubular insulator, but a further step of ablating the insulation at intervals would be undertaken. The second wire would be left fully or partially uninsulated.

DETAILED DESCRIPTION

Figure 1:
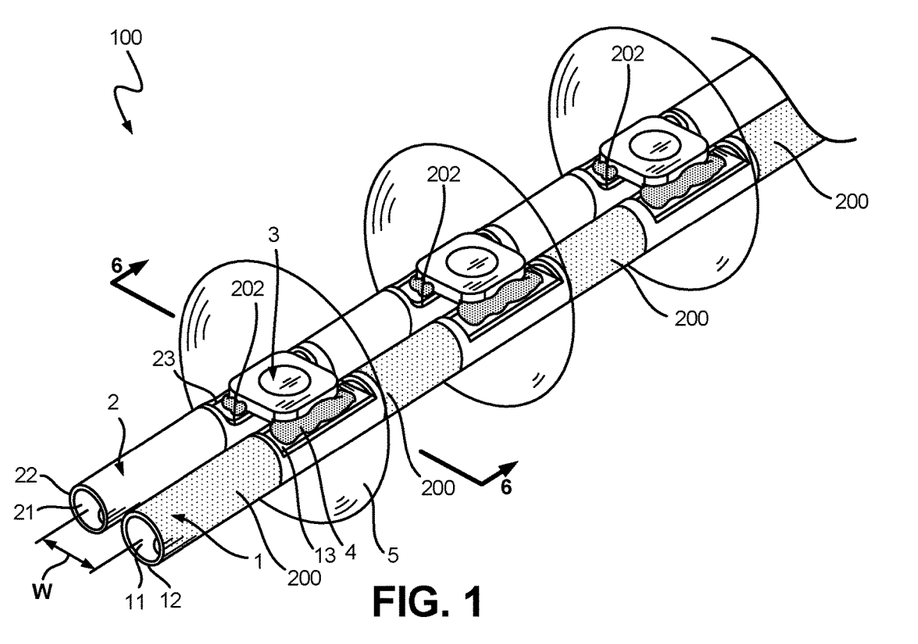
FIG. 1 is a perspective view of a light set with surface mounted light emitting components according to a preferred embodiment of the present invention.

Referring to FIG. 1 that is a perspective view of a light set with surface mounted light emitting components according to a preferred embodiment of the present invention, which is generally denoted by a reference numeral 100. As shown, the light set 100 includes a first conducting wire 1 and a second conducting wire 2, on which at least one surface mounted light emitting components 3 is provided. In this embodiment, only one of the two wires is insulated, i.e. covered or coated with a non conducting material which prevents shorting between the wire pairs. The cost of coating both wires can then be eliminated and the risk of damage to the wire is removed. The wire can be damaged when insulation is removed or when the region for the LED is ablated to make a flat landing space for the LED. The sharp angular cuts at the corners of the ablation are particularly damaging. This thinner region is subject to breaking or kinking during bending.

The first conducting wire 1 has a first conductor 11 and a first insulating layer 12 enclosing the first conductor 11. In the illustrated embodiment, the first conducting wire 1 is an insulated wire with the first conductor 11 being a copper conductor and the first insulating layer 12 being an insulating by, for example, enamel varnish coating on an outer side of the copper conductor. Other forms of insulation are also possible, such as a continuous tubular insulator inserting segments of tubular insulation 200 on the wire such that the insulation segments 200 (shown with stippling) can be spaced apart to provide contact points therebetween, or a thin layer of insulating plastic such as PVC or Teflon or, enamel/lacquer, (also shown with stippling) slid over, extruded, sprayed, dipped over the copper conductor 11. Segments 200 are segments/pieces of hollow tubular insulation pieces sized to be slightly shorter than the distance between contact pads 13.

The second conducting wire 2 is parallelly disposed adjacent to the first conducting wire 1 to space from the latter by a predetermined width W, which could be also be zero or nearly zero, depending on the size of the LED electrical contact locations and spacing. The second conducting wire 2 has a second conductor 21 and no insulating layer 22 on the second conductor 21. The second conducting wire 2 is uninsulated conductor 21 being a copper conductor or other conductive metals such as aluminum or silver. I have come to the unexpected result, against conventional wisdom, that there is no purpose coating the second wire with insulation once the first conductor is insulated and there are disadvantages to doing so.

Of course, the first conducting wire 1 is not necessarily limited to enamel-insulated wires (i.e. applied liquid or power) but can be other types of wires, such as PVC electronic wires, PE wires, Teflon coated conductors, cables, etc. Alternatively, the first conducting wire 1 can be together enclosed in an insulating layer as a power cord. The wires may also be coating with a conductive coating, powercoating, or plating which is not an insulator. The coating could also include metallic flakes which allowed for interesting reflective characteristics or to color the wires without interfering with their electrical accessibility/conductivity.

Figure 2:
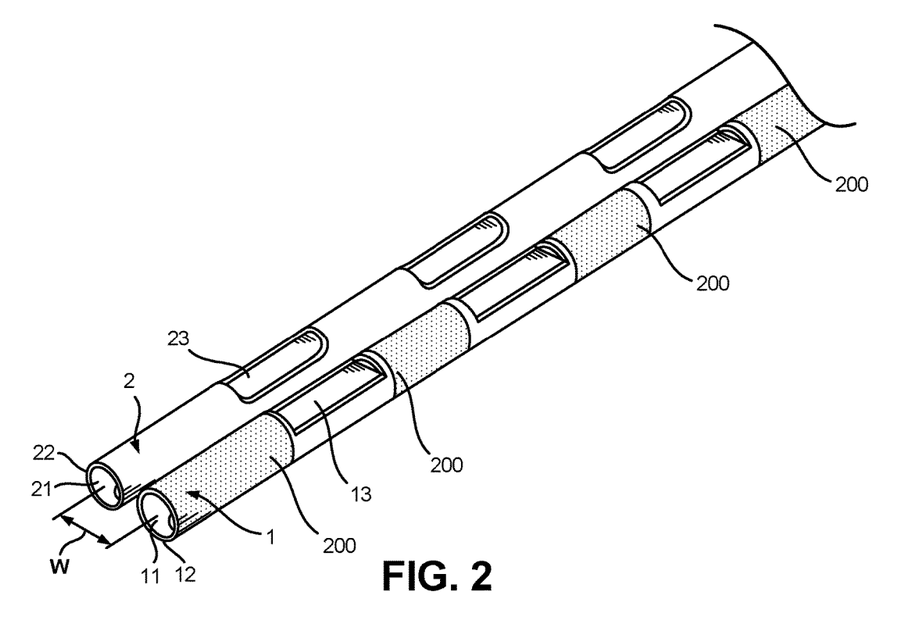
FIG. 2 shows two conducting wires of the light set of FIG. 1, on which contact-pad areas are formed.

Please refer to FIG. 2 that shows the first and the second conducting wire 1, 2 with contact-pad areas 13, 23 formed thereon. As shown, a plurality of first contact-pad areas 13 are formed on the first conducting wire 1 at a predetermined interval D and the first conductor 11 is exposed at the first contact-pad areas 13. Similarly, a plurality of second contact-pad areas 23 are formed on the second conducting wire 2 at the same interval D to correspond to the first contact-pad areas 13, and the second conductor 21 is exposed at the second contact-pad areas 23, however, since the second conducting wire is uninsulated, it does not need an exposed pad. The exposed pads are formed by removing (etching or ablating) the enamel or insulator, but that will necessarily thin the wire at that point making it more susceptible to breakage and by creating a bending point where the wire can kink. Thus, the uninsulated wire better resists breakage and kinking. Kinking is very damaging because it focuses stress on one point. The uninsulated wire provides a form of "guide wire" or "bridge support" effect for the insulated (weaker) wire because it is fully intact, i.e. without ablation.

In practical production of the light set 100, the first conducting wire 1 and the second conducting wire 2 are disposed in parallel spaced apart relationships. Then, the first conducting wire 1 is ground or processed in other manners at the predetermined intervals D to remove a small part of the first insulating layer 12 of the first conducting wire 1 and the second insulating layer 22 of the second conducting wire 2, so as to expose the first conductor 11. This is a damaging effect as explained above, but the fact that the second wire is not affected substantially improves the life of the product. The exposed first conductor 11 may be further grounded to thereby form a plurality of first contact-pad areas 13 which may be flat, but in any case uninsulated, respectively, enabling the surface mounted light emitting components 3 to be easily straddled on and between the first and the second conducting wire 1, 2 at the correspondingly formed flat-topped first and second contact-pad areas 13. As mentioned flat contact pad areas 23 in the second conductor are optional.

Figure 3:
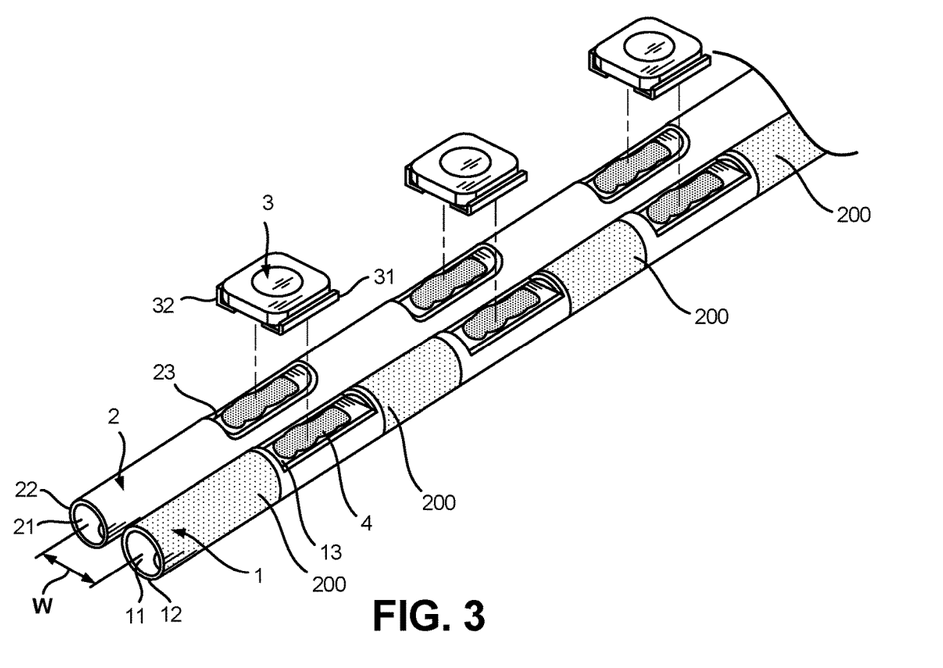
FIG. 3 is an exploded perspective view showing the conducting wires and J or L shaped Lead surface mounted light emitting components of the light set of FIG. 1 in a separated state.
Figure 4:
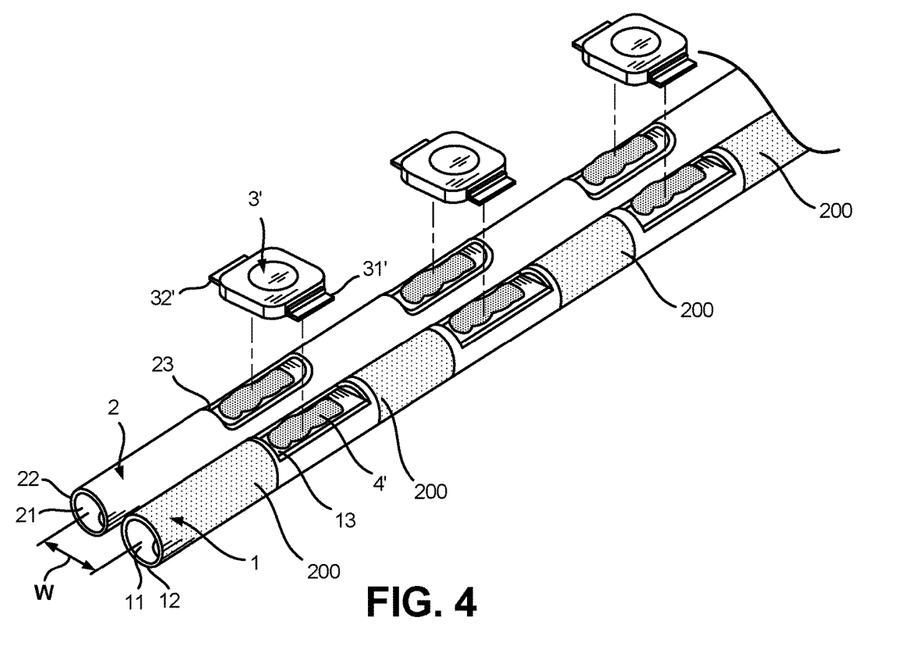
FIG. 4 is another exploded perspective view showing the conducting wires and an outwardly extending lead surface mounted light emitting components of the light set of FIG. 1 in a separated state.
Figure 5:
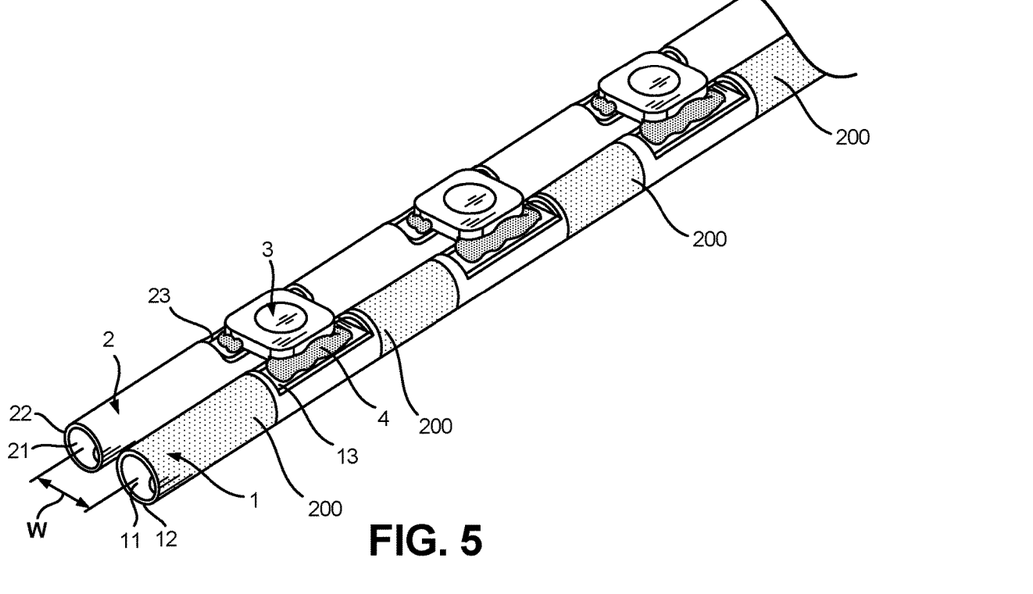
FIG. 5 is an assembled view of FIG. 3.

FIGS. 3 and 4 are two exploded perspective views showing the first and second conducting wires 1, 2 and the surface mounted light emitting components of the light set 100 in a separated state; and FIG. 5 is an assembled perspective view of FIG. 3 showing the first and the second conducting wires 1, 2 and the surface mounted emitting components of the light set 100 in a connected state. Stippling in this example indicates that the entire wire is insulated until portions of the insulation are removed. In the present invention, various types of surface mount device (SMD) light emitting components can be adopted. For example, the light set shown in FIG. 3 has J-lead surface mounted light emitting components 3, and the light set shown in FIG. 4 has gull-wing-lead surface mounted light emitting components 3'. In the embodiments of the present invention illustrated in FIGS. 3 and 4, the light emitting components 3, 3' are surface mounted light-emitting diodes (LED) and each have a first lead 31, 31' and a second lead 32, 32' for connecting to a positive power source and a negative power source, respectively, so that the surface mounted light emitting components 3, 3' can emit light. Similarly, an alternate form of an SMD LED could be attached where the LED is directly mounted to a miniature printed circuit board (PCB), where the pads of the PCB contact conductors 11 and 22 and create the mounting and electrical connection points to the conductors. Such PCB would be virtually invisible.

Since the surface mounted light emitting components 3, 3' are connected to the first and the second conducting wire 1, 2 in the same manner, only the surface mounted light emitting components 3 will be referred to in the following description. Before disposing the surface mounted light emitting components 3 on the first and the second conducting wire 1, 2, first apply a layer of conductive material 4 on the first and the second contact-pad areas 13, 23 of the first and the second conducting wire 1, 2, respectively. In the illustrated embodiment, the conductive material 4 is silver paste, hot solder or other bonding paste. In the alternative, the chip 3 may be bonded by hot solder or merely placed on the wires and then covered with an epoxy material 5 to immobilize the chip on the wires or other alternate bonding method.

The conductive material 4 will, on the one hand, provides good bonding strength between the surface mounted light emitting components 3 and the first and second conducting wires 1, 2 to ensure stable and fixed straddling of the surface mounted light emitting components 3 on and between the corresponding first and second contact-pad areas 13, 23; and, on the other hand, provides good electric conductivity for the first lead 31 and the second lead 32 of the surface mounted light emitting components 3 to electrically connect to the first conductor 11 of the first conducting wire 1 and the second conductor 21 of the second conducting wire 2, respectively, via the conductive material 4, so that the surface mounted light emitting components 3 and the first and second conducting wires 1, 2 are in an electrically connected state. Alternatively the conductive paste could be applied to the conductive areas of the SMD LED.

In practical production of the light set 100, since the first contact-pad areas 13 on the first conducting wire 1 and the second contact-pad areas 23 on the second conducting wire 2 allow the surface mounted light emitting components 3 to stably locate thereon, it is only needed to apply a layer of the conductive material 4 on each of the first and the second contact-pad areas 13, 23 and straddle the surface mounted light emitting components 3 on and between the first and the second contact-pad areas 13, 23 to obtain a firm overall structure for the light set 100. There is no need to solder the leads 31, 32 one by one to the first conductor 11 and the second conductor 21, respectively. Therefore, the light set 100 can be easily and conveniently assembled without difficulties.

Figure 6:
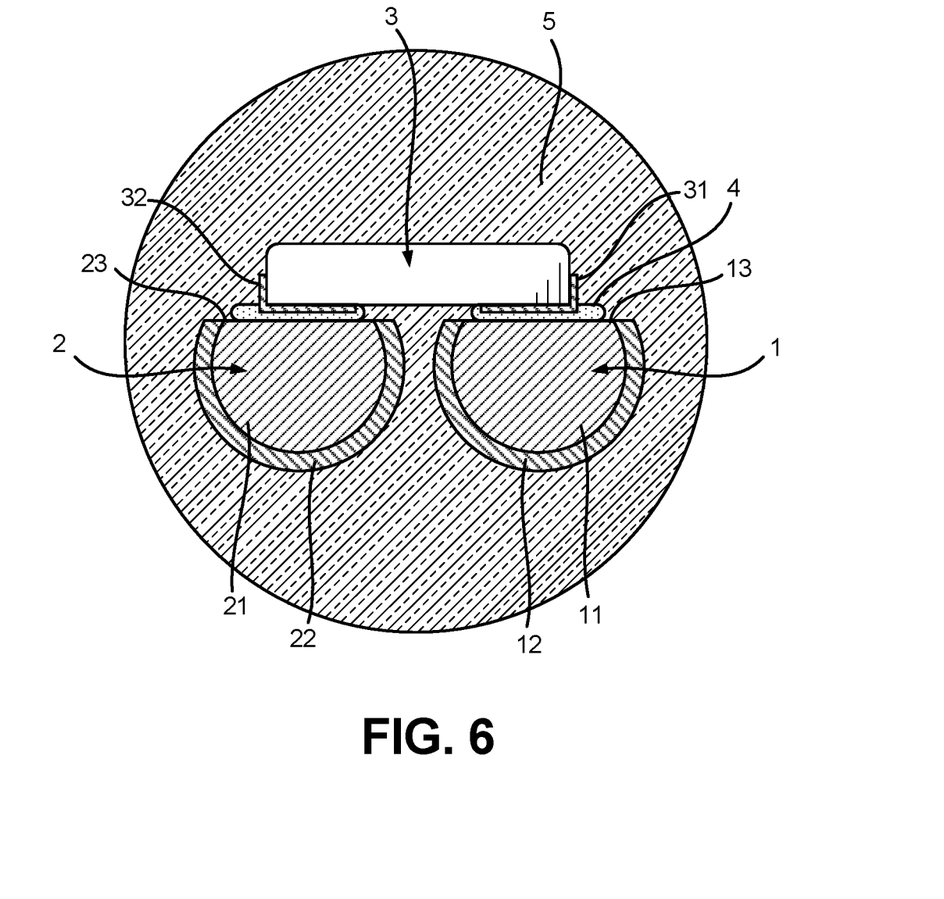
FIG. 6 is an enlarged cross sectional view taken along line 6-6 of FIG. 1.

FIG. 6 is an enlarged cross sectional view taken along line 6-6 of FIG. 1. Please refer to FIGS. 1 and 6 at the same time. In the preferred embodiment of the present invention, after the surface mounted light emitting components 3 have been straddled on and between the first and the second conducting wire 1, 2 at the contact-pad areas 13, 23, a layer of transparent or translucent package 5 is further applied to an outer side of every paired first and second contact-pad areas 13, 23 on the first and the second conducting wire 1, 2 and the surface mounted light emitting component 3 bonded thereto, so as to prevent the surface mounted light emitting components 3 and the exposed first and second conductors 11, 21 of the first and second conducting wires 1, 2 from electrically contacting with an external environment and resume the partially ground off first insulating layer 12 of the first conducting wire 1 respectively, to their original insulating effect. Meanwhile, the transparent or translucent package 5 protects the surface mounted light emitting components 3 against failure due to contacting with external dust and particles. As mentioned, grinding a flat section in the second conductor is optional. Furthermore, it is possible to achieve a flat second in the second conductor by compression (stamping, pounding, flattening etc.) at the selected intervals, if desired. This is less damaging than ablating.

Likewise, this compression/flattening technique could be applied to the insulated wire as well and then the insulation can be removed by etching or dissolving the insulation chemically. This is also less damaging than grinding.

Finally, in the embodiment where tubular sections are applied to the first wire instead of enamel insulation, the stamping/compression technique can be used at the pad points without grinding, on one or both faces of the wire. In the preferred embodiment, the flattening tool should have rounded edges 202 so that no part of the wire has any sharp transitions as this will enhance the kinking/breakage risk.

The transparent or translucent package 5 further strengthens the connection between the surface mounted light emitting components 3 and the first and second conducting wires 1, 2, protecting the surface mounted light emitting components 3 against damage and separation from the conducting wires 1, 2 due to external impact and giving the whole light set 100 with improved reliability. On the other hand, the angle of divergence of the light emitted from the surface mounted light emitting components 3 can also be adjusted via the transparent or translucent package 5 to meet a user's requirement. In this case, it is of course a transparent or translucent material should be selected for the transparent or translucent package 5, so that light emitted from the surface mounted light emitting components 3 can pass through the transparent or translucent package 5. Use of translucent or transparent materials provides different and varying optical and decorative effects including colors to meet a user's requirement.

Figure 7:
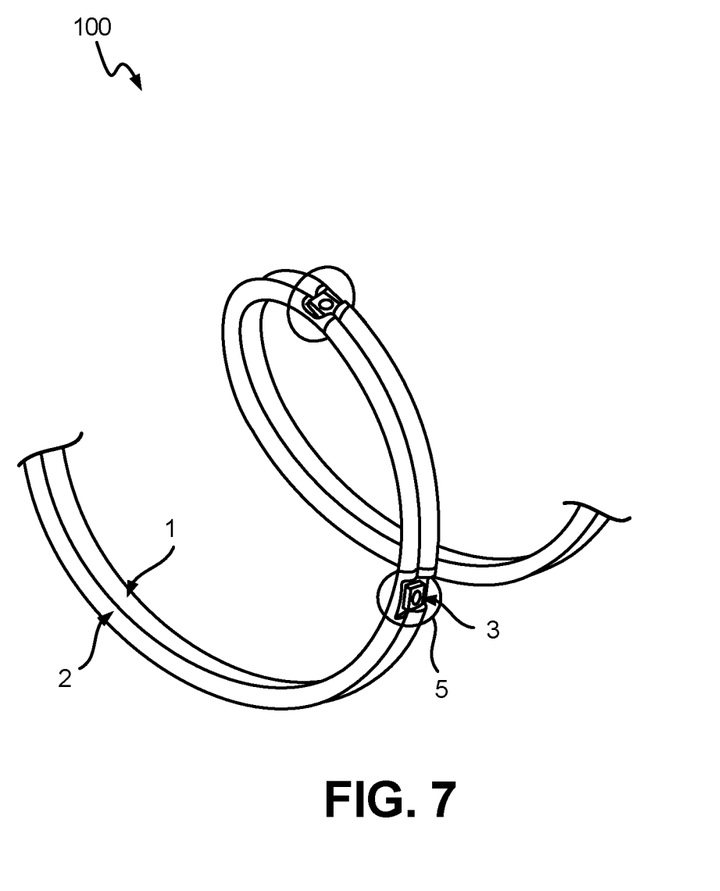
FIG. 7 shows an example of application of the light set with surface mounted light emitting components following a curved path to illustrate how two parallel wires bound together by bridging LED chips can resist kinking forces which might damage the weaker wire.

FIG. 7 shows an example of application of the light set 100. In the preferred embodiment, the spacing between wires is nearly zero for maximum beneficial strengthening effect. As shown, the first and the second conducting wires 1, 2 can be freely bent or coiled to wind around different articles, such as a Christmas tree, a door, a window, etc., or to serve as an ornament. Because bending and coiling will provide maximum stress at the pad points where grinding/ablation may have been used, these points would likely kink/bend sharply. The guide wire effect of the stronger non-insulated wire minimizes this and the product will bend into aesthetically pleasing curved or spiral shapes as shown in FIG. 7 without kinking or bending damage.

In the case where line voltage is applied to the conductors (usually with step down, but without an isolation transformer, it is desirable to insure that the uninsulated wire is always neutral or ground). A polarized plug can be used but also a polarity detection device which will determine which pole is grounded and always assign it to the uninsulated wire or just interrupt the continuity, or display a light, if mispolarized. Of course, an isolation transformer will eliminate this issue. Fuses and/or Ground Fault Circuit Interrupters GFCI may also be applied to either or both conductors.

The disclosure also includes a method of making a light set according to the structures and method provided above and the following methods.

Instead of removing insulation from the wire, thereby weakening the wire, it is possible to protect the wire at intervals prior to being insulated, such as by sprayed or dipped insulator/enamel. For example, the wire can be gripped by a pincher at said intervals and then insulation applied. The gripped areas will not be insulated. Likewise, a paper, plastic or other layer can be removably applied to the wire before coating and then removed.

A method could be for example:
 a. providing temporary coverage of portions of the first wire at intervals along its length;
 b. coating the first wire with an insulator while providing said temporary coverage;
 c. removing said temporary coverage, thereby exposing uninsulated portions of the first wire at known intervals;
 d. placing said second wire in parallel with said first wire;
 e. applying an LED chip in electrical contact with said first and second wires at said uninsulated portions, thereby having the wires electrically bridged by said LED chip.

The second wire could likewise be insulated if desired by:
a. providing temporary coverage of portions of the second wire at intervals along its length;
b. coating the second wire with an insulator while providing said temporary coverage;
c. removing said temporary coverage, thereby exposing uninsulated portions of the second wire at known intervals corresponding to the known intervals of said first wire.

The wire can also be flattened to create a depression in the wire with a flat portion and curved edges.

Curved edges in the depression are created by a compression tool with curved ends.

Although the present invention has been described, it is apparent to those skilled in the art that a variety of modifications and changes may be made without departing from the scope of the present invention which is intended to be defined by the appended claims.

What is claimed is:

1. A method of making an ornamental light set having first and second parallel wires and plurality of LED chips having electrical contacts, comprising the steps of:
   a. coating the first wire with an insulator to provide said insulating coverage;
   b. removing said temporary insulating coverage at a plurality of predetermined intervals along the length of the wire, thereby exposing uninsulated portions of the first wire at intervals, the extent of removed insulating coverage at said intervals being sufficient to receive at least a portion of said LED chip electrical contact;
   c. placing said second uninsulated wire in parallel with said first wire;
   d. applying a plurality of LED chips in electrical contact with said first and second wires at said uninsulated portions of said first wire, thereby having the wires electrically bridged by said LED chips at said intervals.

2. The method of claim 1 further including flattening the first wire at said uninsulated portions.

3. The method of claim 2, wherein said second wire is flattened at points corresponding to adjacent uninsulated portions on said first wire.

4. The method of claim 1 further including:
   a. providing temporary coverage of portions of the second wire at intervals along its length;
   b. coating the second wire with an insulator while providing said temporary coverage;
   c. removing said temporary coverage, thereby exposing uninsulated portions of the second wire at predetermined intervals corresponding to the predetermined intervals of said first wire.

5. The method of claim 2 wherein the flattening includes creating a depression in the wire with a flat portion and curved edges.

6. The method of claim 1 further including coating at least one conductor with an electrically conductive colored coating.

7. A method of making a stronger light set having first and second parallel wires and plurality of spaced apart LED chips comprising the steps of:
   a. locating a first insulated wire and locating a second uninsulated wire adjacent but spaced apart from said first wire;
   b. removing portions of insulation from said first insulated wire at periodic intervals along at least a part of its length the second wire being uninsulated at least along said part of its length;
   c. physically and electrically affixing LED chips to said wires, the chips bridging said first and second wires, said chips being in physical and electrical contact with said first and second wires at said intervals, thereby having the wires electrically bridged by said LED chips and wherein said uninsulated wire provides anti-kinking support to said insulated wire.

8. The method of claim 7 wherein the intervals on said insulated wire are further formed by flattening the insulated wire to produce a flat region at the intervals.

9. The method of claim 7 wherein the intervals on said uninsulated wire are further formed by flattening the first conductor to produce a flat region adjacent said intervals on said insulated wire.

10. The method of claim 7 wherein the intervals on said insulated wire are further formed by ablading away insulation and then by flattening the wire at said intervals to produce a flat region.

11. The method of claim 7 wherein the intervals on said insulated wire are further formed etching away insulation.

12. The method of claim 7 wherein the intervals on said insulated wire are further formed dissolving away insulation and then by flattening the wire at said intervals to produce a flat region.

* * * * *